United States Patent
Oyama et al.

(10) Patent No.: US 6,218,877 B1
(45) Date of Patent: Apr. 17, 2001

(54) SEMICONDUCTOR DEVICE WITH DELAY LOCKED LOOP

(75) Inventors: Kazuhiko Oyama; Hiroaki Kawano, both of Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/316,037

(22) Filed: May 21, 1999

(30) Foreign Application Priority Data

Dec. 16, 1998 (JP) .................................................. 10-357608

(51) Int. Cl.⁷ ....................................................... H03L 7/06
(52) U.S. Cl. ............................................. 327/158; 327/161
(58) Field of Search .................................. 327/158, 146, 327/147, 153, 155, 156, 161, 163, 162

(56) References Cited

U.S. PATENT DOCUMENTS 5,087,829 * 2/1992 Ishibashi et al. ..................... 307/269
5,994,934 * 11/1999 Yoshimura et al. ................. 327/158

FOREIGN PATENT DOCUMENTS

| 8-97714 | 4/1996 | (JP) . |
| 8-130464 | 5/1996 | (JP) . |
| 8-167890 | 6/1996 | (JP) . |
| 8-274630 | 10/1996 | (JP) . |
| 9-17179 | 1/1997 | (JP) . |
| 10-39944 | 2/1998 | (JP) . |

* cited by examiner

*Primary Examiner*—Toan Tran
*Assistant Examiner*—Linh Nguyen
(74) *Attorney, Agent, or Firm*—Jones Volentine, L.L.C.

(57) ABSTRACT

A semiconductor device capable of easily adjusting an internal delay time is provided with a phase adjusting circuit, wherein the phase adjusting circuit comprises an internal delay reproduction circuit that reproduces the sum of a delay time required for an input signal to be input to the phase adjusting circuit and a delay time required for an output signal to be output from the phase adjusting circuit. A delay adjusting circuit connected with the internal delay reproduction circuit upstream or downstream relative thereto, generates a given delay time for adjusting the internal delay time reproduced by the internal delay reproduction circuit. A delay time control section is connected with the delay adjusting circuit and controls the delay time generated by the delay adjusting circuit. A phase comparator compares a phase of a signal passed through the delay time adjusting circuit with a signal inputted to the phase adjusting circuit. A delay selection circuit generates a given delay time for allowing a phase of the signal passed through the delay adjusting circuit to coincide with a phase of the signal inputted to the phase adjusting circuit, based on an output of the phase comparator.

19 Claims, 7 Drawing Sheets

SEMICONDUCTOR DEVICE WITH DELAY LOCKED LOOP

BACKGROUND OF THE INVENTION

1. Field of the Invention

The invention relates to a semiconductor device, particularly to a semiconductor device provided with a delay locked loop (DLL) for phasing a signal inputted to or a signal outputted from the semiconductor device.

2. Description of the Related Art

There is a semiconductor device provided with a DLL circuit for phasing an input signal inputted from an outside of a semiconductor device, for example, an input clocked signal with an output signal which is outputted to the outside of the semiconductor device, for example, an output clock signal. The DLL circuit is provided with an internal delay reproduction circuit. The internal delay reproduction circuit reproduces delay time (hereinafter referred to as internal delay time) that is the sum of a delay time of a signal taken for inputting to the DLL circuit through an input pin via a pad or a buffer and a delay time of a signal taken for outputting from the DLL circuit through an output pin via the buffer or the pad. The internal delay time reproduced by the internal delay reproduction circuit is generally adjusted in advance by a metal option.

Since there occurs dispersion in process such as difference between rods and devices in mass production of semiconductor devices, there occurs the necessity to readjust the internal delay reproducing circuit. However, since the internal delay reproducing circuit is adjusted by a metal option in a conventional semiconductor device, it is very difficult to adjust or evaluate the internal delay reproducing circuit.

SUMMARY OF THE INVENTION

It is an object of the invention to provide a new and improved semiconductor device provided with a DLL circuit capable of easily adjusting an internal delay time.

To achieve the above object, a semiconductor device according to an embodiment of the invention comprises an input terminal to which an input signal is inputted from the outside of the device, an output terminal from which an output signal is outputted to the outside of the device, and a phase adjusting circuit for phasing the input signal with the output signal, wherein the phase adjusting circuit comprises an internal delay reproduction circuit for reproducing the sum of a delay time of the input signal taken for inputting to the phase adjusting circuit and a delay time of the output signal taken for outputting from the phase adjusting circuit as the output signal, a delay adjusting circuit connected with the internal delay circuit upstream or downstream relative thereto for generating a given delay time for adjusting the internal delay time reproduced by the internal delay reproduction circuit, a delay time control section connected with the delay adjusting circuit for controlling the delay time generated by the delay adjusting circuit, a phase comparator for comparing a phase of a signal passed through the delay time adjusting circuit with a signal inputted to the phase adjusting circuit, and a delay selection circuit for generating a given delay time for allowing a phase of the signal passed through the delay adjusting circuit to coincide with a phase of the signal inputted to the phase adjusting circuit. The delay time control section comprises a plurality of fuse circuits including fuses so as to control the delay time generated by the delay adjusting circuit when fuses are burnt.

With such a construction, when the fuses are burnt, a delay time can be easily adjusted. There is another effect that devices which become failed caused by the difference in processes can be saved by adjusting the delay time by burning fuses when probing, and yield can be improved.

Further, the delay adjusting circuit may be provided with delay elements having the number that is less than one from the square of the number of fuse circuits. In this case, the delay elements may be formed of resistor elements. With such a construction, the number of resistor that is employed on the delay circuit may be changed to $2^n$ possible numbers depending on whether respective fuses provided in n fuse circuits are burnt or not, and hence the delay time can be easily adjusted. When a delay generation section of the delay circuit is composed of resistors, there is no restraint on the layer to be achieved, thereby extending an area where a layout is provided.

Further, the delay elements may be formed of inverter elements. With such a construction, since each delay element is composed of each inverter, a layout can be achieved by a small space, and hence an influence by a wiring load can be reduced.

Still further, the delay time control section comprises a plurality of latch circuits wherein the delay time generated by the delay adjusting circuit may be controlled by external address information that is inputted to each latch circuit. With such a construction, the internal delay time can be easily controlled by inputting external address information. Further, since the delay time can be adjusted even after the delay adjusting circuit is incorporated into a mold, the evaluation including the influence of a package can be easily performed.

Further, the delay circuit may be provided with delay elements having the number less than one from the square of the latch circuits, wherein the delay elements may be formed of resistors. With such a construction, the number of resistors employed by the delay circuit can be changed by $2^n$ by control n latch circuits, thereby easily adjusting the delay time. Further, the delay generation section of the delay circuit is composed of resistors, there is no limit in layers to be achieved, thereby extending an area where a layout is provided.

Still further, the delay elements are composed of even number of inverter elements. With such a construction, since the delay elements are composed of the inverter elements, a layout can be achieved by a small space and the influence by a wiring load can be reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

A semiconductor device according to preferable embodiments of the invention is described in detail with reference the attached drawings. In this specification and drawings, components having substantially the same function in the specification and the drawings are denoted by the same reference numerals so as to omit an overlapping explanation thereof.

An example of a general semiconductor device provided with a phase adjusting circuit for phasing an input signal and an output signal is explained with reference to FIG. 1.

Figure 1:
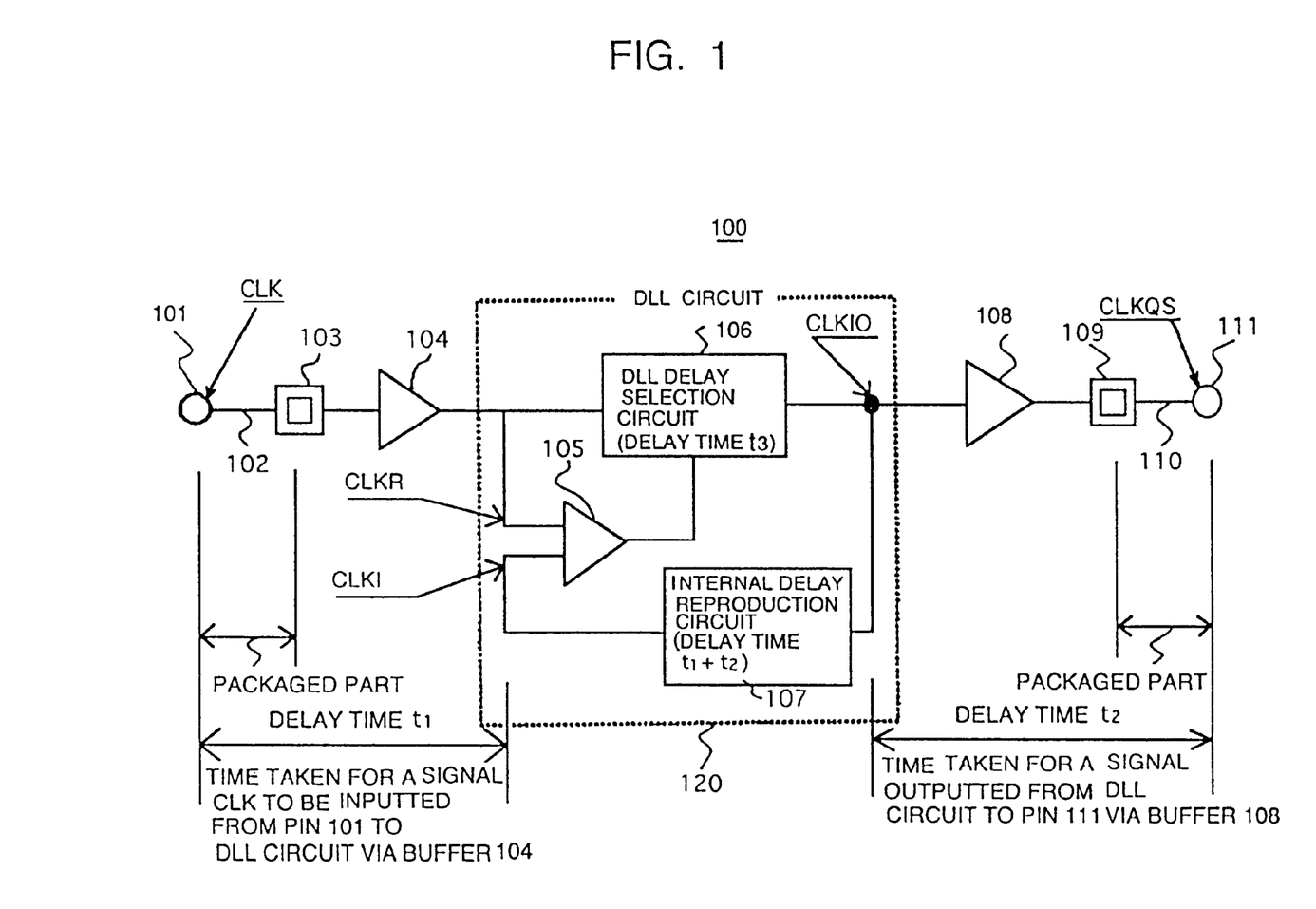
FIG. 1 is a general semiconductor device provided with a DLL circuit.

A semiconductor device 100 comprises, as shown in FIG. 1, a pin 101 to which an input clock signal CLK is inputted, a lead frame wire 102 through which the input clock signal CLK is transmitted, a pad 103, an input stage buffer 104, a DLL circuit 120 to which the input clock signal CLK is inputted via the input stage buffer 104, an output stage buffer 108 to which an output of the DLL circuit 120 is transmitted, a pad 109, a lead frame wire 110, and a pin 111 which is connected with the lead frame wire 110 for outputting an output clock signal CLKQS.

The DLL circuit 120 comprises, as shown in FIG. 1, an internal delay reproduction circuit 107 for reproducing total delay time $t_1+t_2$ (hereinafter referred to as internal delay time $t_1+t_2$) that is the sum of delay time $t_1$ taken for the input clock signal CLK to be inputted to the DLL circuit 120 and a delay time $t_2$ taken for the signal CLKIO to be outputted from the DLL circuit 120 as an output clock signal CLKQS, a phase comparator 105 connected with the internal delay reproduction circuit 107 downstream relative thereto, and a DLL delay selection circuit 106 for generating a given delay time $t_3$ for allowing the phase of a signal CLKI passed through the internal delay reproduction circuit 107 to coincide with the phase of a signal CLKR to be inputted to the DLL circuit 120.

The internal delay time $t_1+t_2$ reproduced by the internal delay reproduction circuit 107 is adjusted in advance by a metal option. The input clock signal CLK and the output clock signal CLKQS in the semiconductor device 100 are phased by comparing the phase of the signal CLKI passed through the internal delay reproduction circuit 107 with the phase of the signal CLKR to be inputted to the DLL circuit 120 by the phase comparator 105, and allowing these compared phases to coincide with each other by the DLL delay selection circuit 106 instead of direct comparison and coincidence between the input clock signal CLK and the output clock signal CLKQS.

Although the signal CLKI and the signal CLKR are phased with each other by the phase comparator 105 and the DLL delay selection circuit 106, the input clock signal CLK and the output clock signal CLKQS are not automatically phased with each other, as will be described later, and hence the internal delay produced by the internal delay reproduction circuit 107 needs to be accurately reproduced. However, if there is inconvenience in adjustment of the internal delay reproduction circuit 107, the signal CLKI and the signal CLKR are phased with each other but the input clock signal CLK and the output clock signal CLKQS are not phased with each other.

The operation of the semiconductor device 100 having the above construction is described with reference to FIG. 1, and also a case where the internal delay of the internal delay reproduction circuit 107 is accurately reproduced is described with reference to FIG. 2, and further a case where the internal delay of the internal delay reproduction circuit 107 is not accurately reproduced is described with reference to FIG. 3.

The input clock signal CLK inputted through the pin 101 is inputted to the pad 103 via the lead frame wire 102, and inputted to the DLL circuit 120 as the signal CLKR via the input stage buffer 104. At this time, it takes delay time $t_1$ for the input clock signal CLK to be inputted from the pin 101 to the DLL circuit 120 via the input stage buffer 104. Accordingly, the signal CLKR is a signal behind the input clock signal CLK by delay time $t_1$ as shown in FIG. 2.

The signal CLKR inputted from the input stage buffer 104 to the DLL circuit 120 is outputted to the outside of the DLL circuit 120 via the DLL delay selection circuit 106 as the signal CLKIO. At this time, the signal takes delay time $t_3$ when it passes through the DLL delay selection circuit 106. Accordingly, the signal CLKIO is a signal behind the signal CLKR by delay time $t_3$ as shown in FIG. 2, although the signal CLKR is inputted to the phase comparator 105, as will be described later.

The signal CLKIO outputted from the DLL delay selection circuit 106 passes through the output stage buffer 108, pad 109, and lead frame wire 110, then it is outputted to the pin 111 as the output clock signal CLKQS. At this time, it takes delay time $t_2$ for the signal to be outputted from the DLL circuit to the pin 111 via the output stage buffer 108. Accordingly, output clock signal CLKQS is a signal behind the signal CLKIO by delay time $t_2$ as shown in FIG. 2.

The signal CLKIO outputted from the DLL delay selection circuit 106 is inputted to one input terminal of the phase comparator 105 via the internal delay reproduction circuit 107 of the DLL circuit 120 as the signal CLKI. Since the signal CLKI is delayed by internal delay time $t_1+t_2$ by the internal delay reproduction circuit 107, it is a signal behind the signal CLKIO by internal delay time $t_1+t_2$ as shown in FIG. 2.

The signal CLKR is inputted to the other input terminal of the phase comparator 105. The delay time $t_3$ of the DLL delay selection circuit 106 is adjusted for phasing the signal CLKI with the signal CLKR as shown in FIG. 2.

Figure 2:
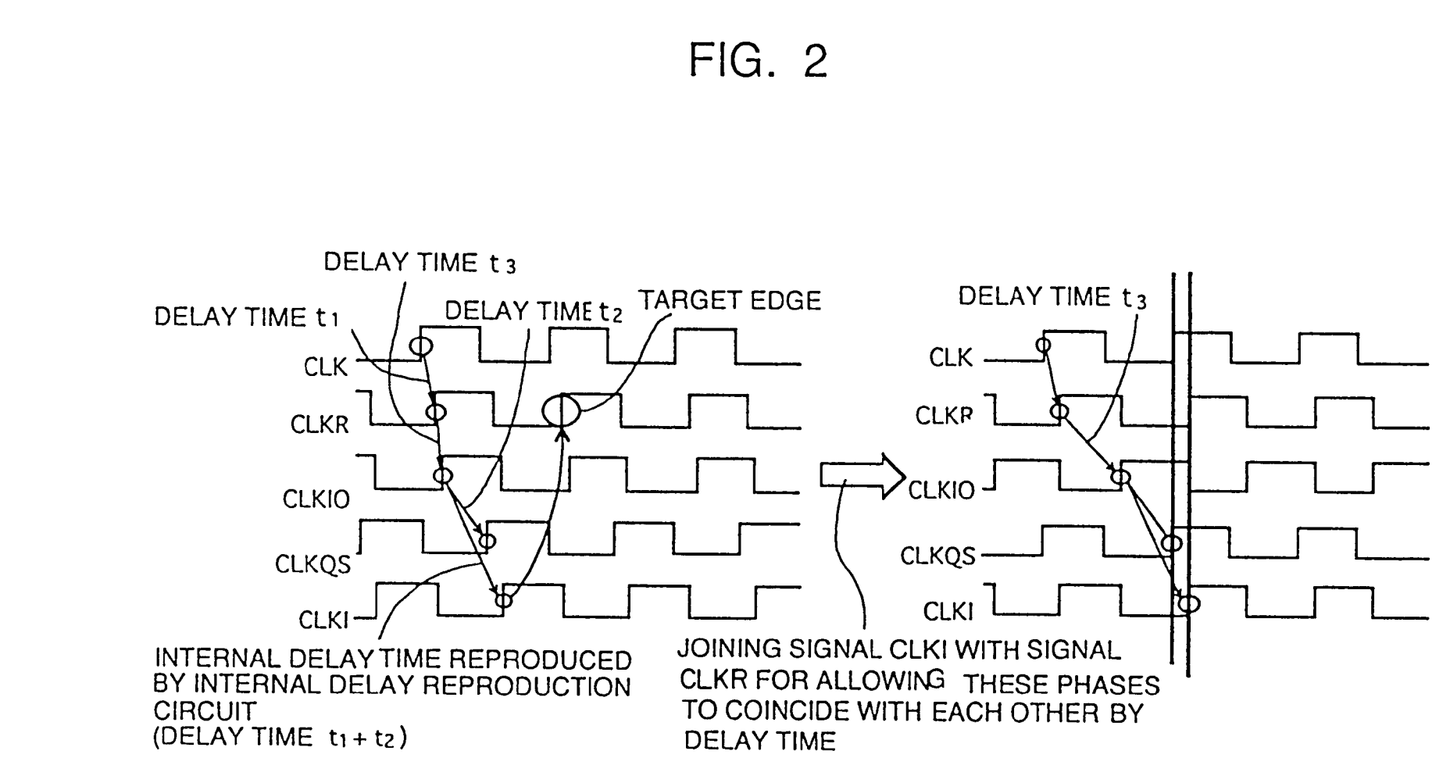
FIG. 2 is a timing chart showing the operation of the semiconductor device in FIG. 1.
Figure 3:
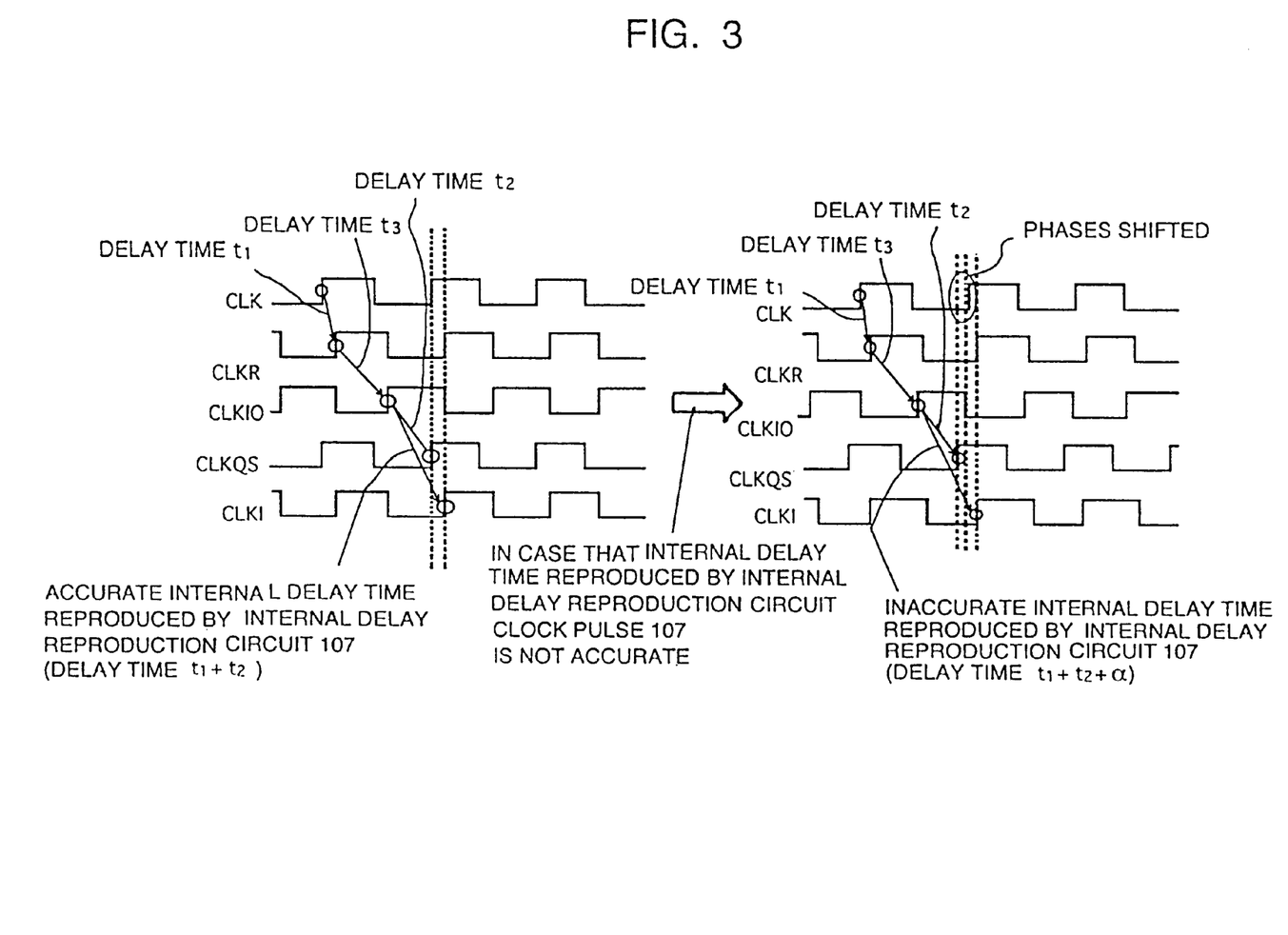
FIG. 3 is another timing chart showing the operation of the semiconductor device in FIG. 1.

Delay time $t_3$ of the DLL delay selection circuit 106 is adjusted, as shown in FIG. 2, so as to join the phase of the input clock signal CLK with that of the signal CLKR.

As described above, the signal CLKR and the signal CLKI are respectively inputted to the phase comparator 105 of the DLL circuit 120 in order to allow the input clock signal CLK to coincide with the output clock signal CLKQS, so that the input clock signal CLK and the output clock signal CLKQS are joined with each other by delay time $t_3$ of the DLL delay selection circuit 106 so as to remove the phase difference therebetween. As a result, the phase of signal CLKR coincides with that of the signal CLKI, and hence, the phase of the input clock signal CLK coincides with that of the output clock signal CLKQS.

Meanwhile, as mentioned above, in the DLL circuit, the signal CLKR is compared with the signal CLKI instead of comparing the input clock signal CLK with the output clock signal CLKQS. Accordingly, it is necessary to accurately reproduce the internal delay time $t_1+t_2$ in the internal delay reproduction circuit 107 for generating the signal CLKI. In case that the internal delay is not accurately reproduced such as a case that the reproduction by the internal delay reproduction circuit 107 is internal delay time $t_1+t_2+\alpha$ relative to internal delay time $t_1+t_2$, there occurs the phase difference between the input clock signal CLK and output clock signal CLKQS although the phase of signal CLKR coincides with that of the signal CLKI.

Next, the semiconductor device according to a first embodiment of the invention is described in detail while clarifying the difference between the semiconductor device of the first embodiment and the general semiconductor device set forth above.

A semiconductor device 200 according to the first embodiment of the invention is described with reference to FIG. 4.

Figure 4:
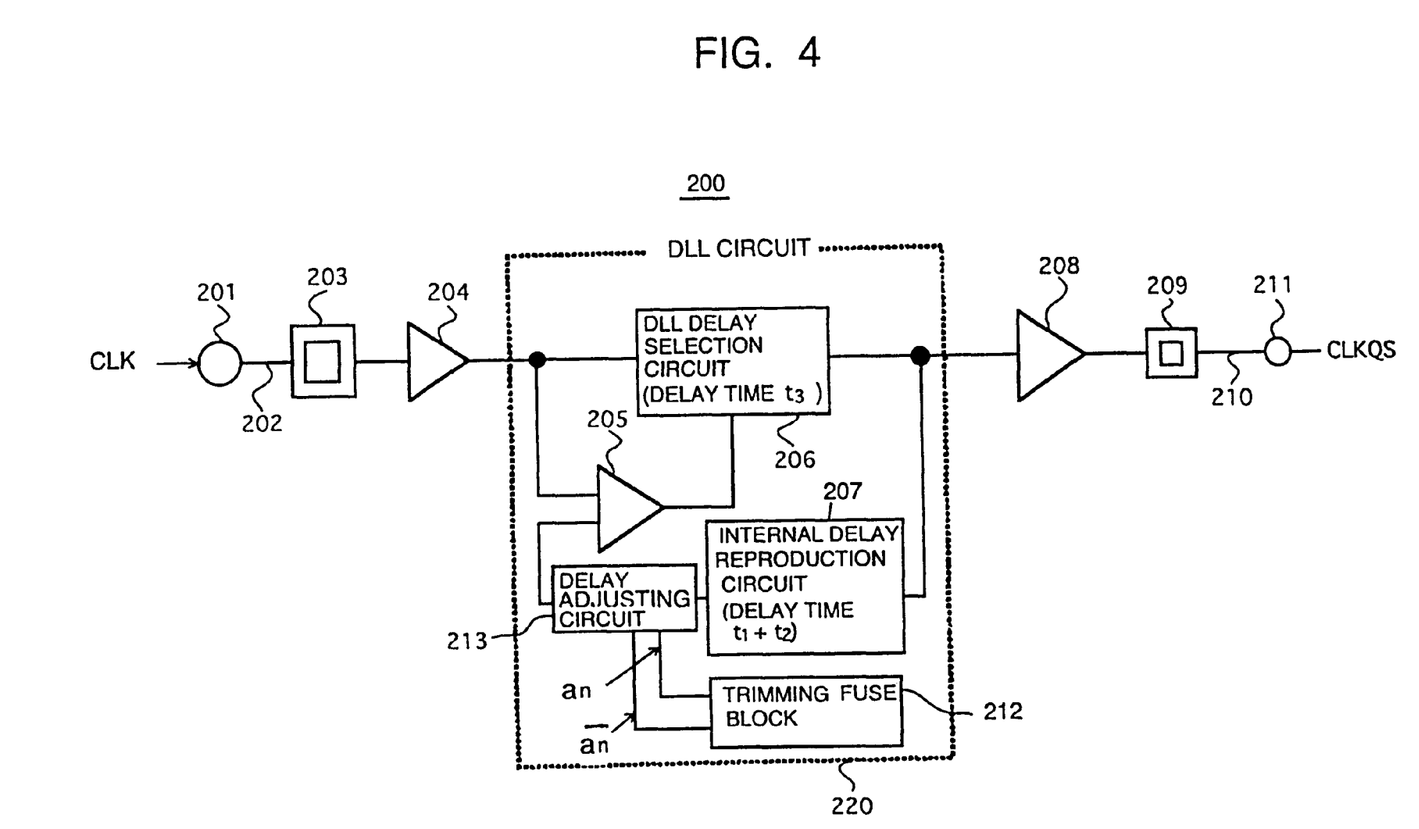
FIG. 4 is a view for explaining a semiconductor device according to a first embodiment of the invention.

As shown in FIG. 4, the semiconductor device 200 comprises a pin 201 to which an input clock signal CLK is inputted, a lead frame wire 202 through which the input clock signal CLK is transmitted, a pad 203, an input stage buffer 204, a DLL circuit 220, to which the input clock signal CLK is inputted via the input stage buffer 204, an output stage buffer 208, to which an output of the DLL circuit 220 is transmitted, a pad 209, a lead frame wire 210, and a pin 211 that is connected with the lead frame wire 210 for outputting an output clock signal CLKQS.

The DLL circuit 220 comprises, as shown in FIG. 4, an internal delay reproduction circuit 207 for reproducing an internal delay time $t_1+t_2$ that is the sum of delay time $t_1$ taken for the input clock signal CLK to be inputted to the DLL circuit 220 and a delay time $t_2$ taken for the signal CLKIO outputted from the DLL circuit 220 to be inputted to the pin 211 as the output clock signal CLKQS, a delay adjusting circuit 213 connected with the internal delay reproduction circuit 207 downstream relative thereto for generating a given delay time for adjusting the internal delay time reproduced by the internal delay reproduction circuit 207, a phase comparator 205 connected with the delay adjusting circuit 213 downstream relative thereto for comparing the phase of a signal passed through the delay adjusting circuit 213 and the phase of the signal inputted to the DLL circuit 220, and a DLL delay selection circuit 206 for generating a given delay time $t_3$ to allow the phase of a signal CLKI passed through the internal delay reproduction circuit 207 and the phase of a signal CLKR to be inputted to the DLL circuit 220.

The DLL circuit 220 according to the first embodiment further includes, as shown in FIG. 4, the delay adjusting circuit 213 connected with the internal delay reproduction circuit 207 downstream relative thereto for generating a given delay time for adjusting the internal delay time reproduced by the internal delay reproduction circuit 207 and a trimming fuse block 212 serving as a delay time control section connected with the delay adjusting circuit 213 for controlling the delay time generated by the delay adjusting circuit 213. The delay adjusting circuit 213 may be provided upstream relative to the internal delay reproduction circuit 207.

Figure 5:
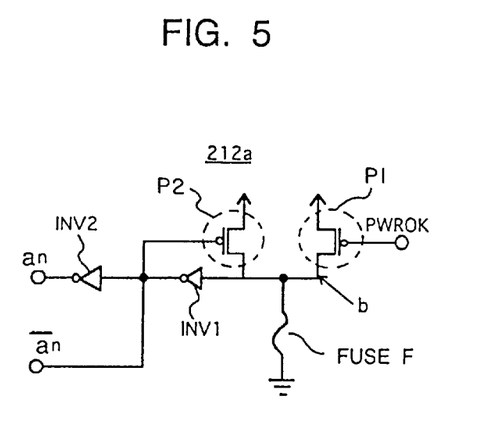
FIG. 5 is a view for explaining trimming fuse circuits.

The trimming fuse block 212 and delay adjusting circuit 213 according to the first embodiment of the invention are described with reference FIGS. 5 and 6.

The trimming fuse block 212 comprises a plurality of trimming fuse circuits. A trimming fuse circuits 212a comprises, as shown in FIG. 5, n-channel MOS transistors (hereinafter referred to as PMOSes) P1 and P2, fuses F, inverter elements INV1 and INV2.

A gate of the PMOS P1 is connected with an initial signal PWROK when powering an external power supply, and a source thereof is connected with the power supply and a drain thereof is connected with a node b. The node b is connected with the fuses F, which is grounded at one terminal, and the inverter element INV1. A signal passed through the inverter element INV1 is outputted to the delay adjusting circuit 213, described later, as a signal /$a_n$, and also outputted to the delay adjusting circuit 213 as a signal $a_n$ via the inverter element INV2, then connected with a gate of the PMOS P2. A source of the PMOS P2 is connected with the power supply and a drain thereof is connected with the node b. The initial signal PWROK when powering the external powering supply is low level immediately after powering and becomes high level after an internal power supply is stabilized.

With the construction set forth above, the signal $a_n$ that becomes a selection signal of delay time is low level when connecting with the fuses F, and the initial signal PWROK becomes low level when powering at the time of burning the fuses F so that the node b becomes high level to latch high level. One of plural delay times in the delay adjusting circuit is selected by providing plurality of information of the fuses F.

That is, if the trimming fuse block 212 comprises n trimming fuses, $2^n$ possible signal groups can be generated by burning or connecting n fuses with each other. With the employment of such signal groups, one of possible $2^n$ delay times is selected by the delay adjusting circuit 213.

Figure 6:
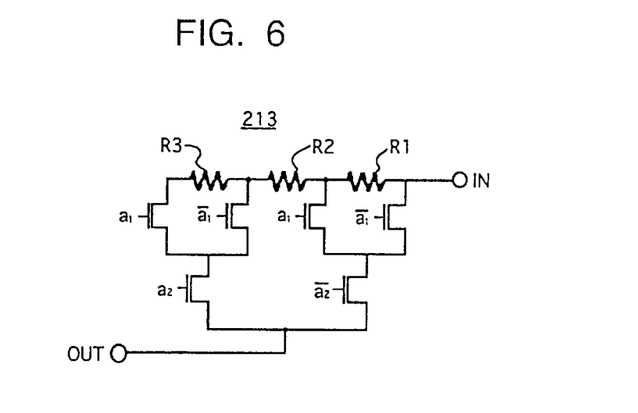
FIG. 6 is a view for explaining a delay circuit.

The delay adjusting circuit 213 comprises, as shown in FIG. 6, resistor elements R1 to R3 serving as a plurality of delay elements, a terminal IN through which a signal is inputted from the internal delay reproduction circuit 207 to the delay adjusting circuit 213, a terminal OUT through which a signal is outputted from the delay adjusting circuit 213 to the phase comparator 205, and a plurality of NMOSes. In the delay adjusting circuit 213, the signal $a_n$ and the signal /$a_n$ are inputted to gates of the NMOSes, thereby changing the number of resistor elements through which the signals pass by deciding paths from the terminal IN to terminal OUT. This means that the delay adjustment of the delay adjusting circuit 213 can be controlled by the signal $a_n$ and the signal /$a_n$ that are generated by the trimming fuse block 212.

If the trimming fuse block 212 comprises n trimming fuse circuits, the delay adjusting circuit 213 includes ($2^n-1$) resistors. FIG. 6 shows a case where n=2. The number of resistors of the delay adjusting circuit 213 can be adjusted in the range from 0 to $2^n-1$ depending whether the fuses of n trimming fuse circuits 212a of the trimming fuse block 212 are burnt or not, thereby preparing possible $2^n$ delay patterns.

In FIG. 6, for example, if a signal /$a_1$ is high level and a signal $a_2$ is high level, a signal inputted from the terminal IN is delayed when passed through the resistors R1 and R2 and then outputted from the terminal OUT.

As mentioned above, according to the semiconductor device 200 of the first embodiment, since the delay adjusting circuit 213 for adjusting the delay of the internal delay reproduction circuit 207 is provided and it is controlled by the trimming fuse block 212, the delay time can be easily adjusted by burning fuses in the fuse block.

Since the devices which become failed caused by the difference in processes can be saved by adjusting delay time by burning fuses when probing, yield can be improved. Still further, since the delay generation section of the delay adjusting circuit 213 comprises resistors, there is no restraint on the adjusting stages and a layout can be easily provided.

Next, a semiconductor device 200' according to a second embodiment of the invention is described. In the semiconductor device 200', the delay adjusting circuit 213 in the semiconductor device 200 of the first embodiment is replaced with a delay adjusting circuit 213' shown in FIG. 7. The construction and connection of the components other than the delay adjusting circuit 213' in the semiconductor device 200' are substantially the same as those of the semiconductor device 200, and hence an explanation thereof is omitted.

Figure 7:
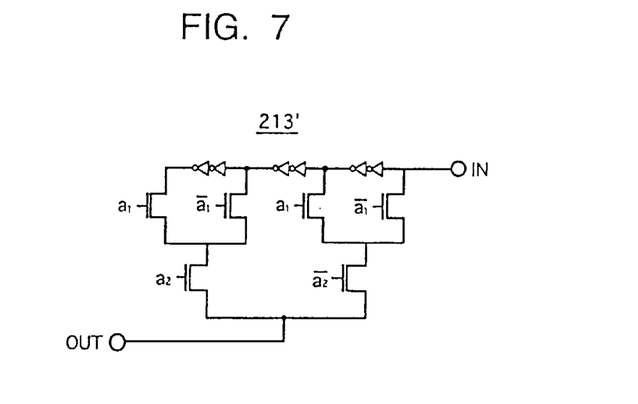
FIG. 7 is a view for explaining another delay circuit.

The delay adjusting circuit 213' is a circuit for adjusting the delay of the internal delay reproduction circuit 207. Although the delay of the internal delay reproduction circuit is adjusted using resistors shown in FIG. 6 according to the delay adjusting circuit 213 of the first embodiment, the delay adjusting circuit 213' adjusts the delay of the internal delay reproduction circuit using even number of inverter elements instead of resistors as shown in FIG. 7. Although FIG. 7 shows an example of a case of employment of two inverter elements, the invention is not limited to this case but the number of inverter elements can be appropriately designed and the number thereof can be appropriately changed. The delay adjusting circuit 213' is controlled by signals $a_n$ and $/a_n$ that are generated by the trimming fuse block 212 shown in FIG. 5. Since the operation of the delay adjusting circuit 213' is substantially the same as that of the delay adjusting circuit 213 of the first embodiment, an explanation thereof is omitted.

As explained above, according to the semiconductor device 200' of the second embodiment, in addition to the effect that is substantially the same as that of the semiconductor device 200 of the first embodiment, there is another effect that the layout is performed with smaller space and the influence by the wiring load can be reduced compared with the semiconductor device 200 of the first embodiment.

Figure 8:
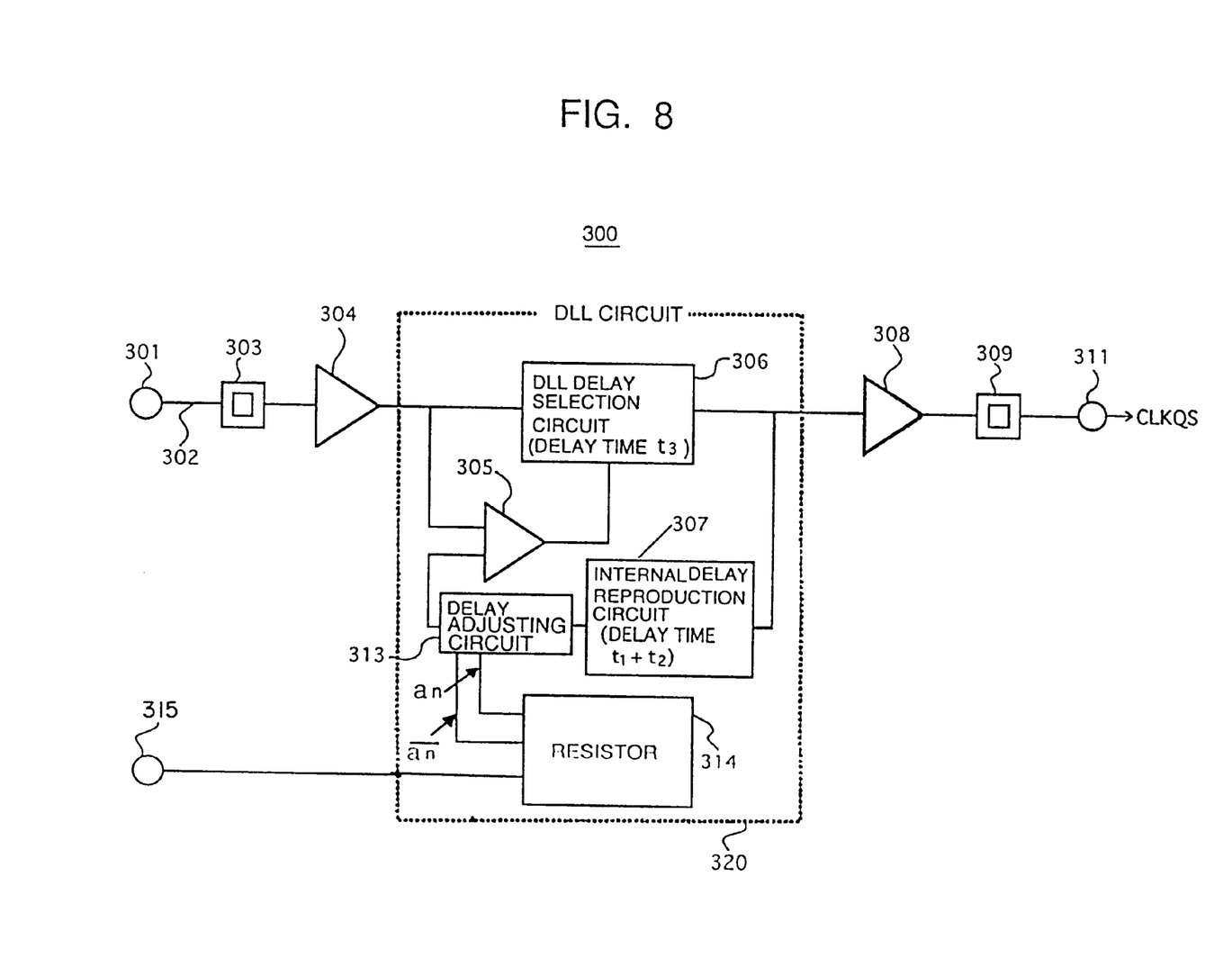
FIG. 8 is a view for explaining a semiconductor device according to a second embodiment of the invention.

A semiconductor device 300 according to a third embodiment of the invention is described with reference to FIG. 8. In the semiconductor device 300, the trimming fuse block 212 in the semiconductor device 100 of the first embodiment is replaced with a resistor 314 as shown in FIG. 8. Since the construction and connection of components other than the resistor 314 of the semiconductor device 300 are substantially the same as those of the semiconductor device 200, an explain thereof is omitted. The delay adjusting circuit 313 may comprise resistors of the delay adjusting circuit 213 of the first embodiment or may comprise inverter elements of the delay adjusting circuit 213' of the second embodiment.

Figure 9:
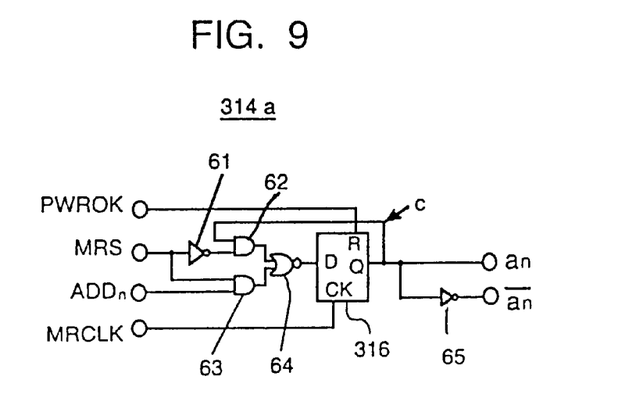
FIG. 9 is a view for explaining a latch circuit.
Figure 10:
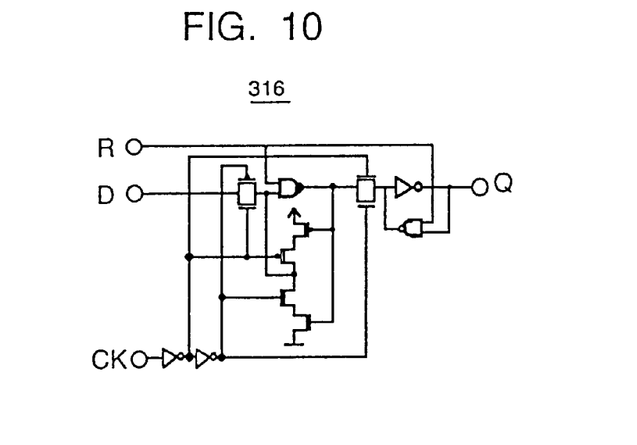
FIG. 10 is a view for explaining a flip-flop employed by the latch circuit of FIG. 9.
Figure 11:
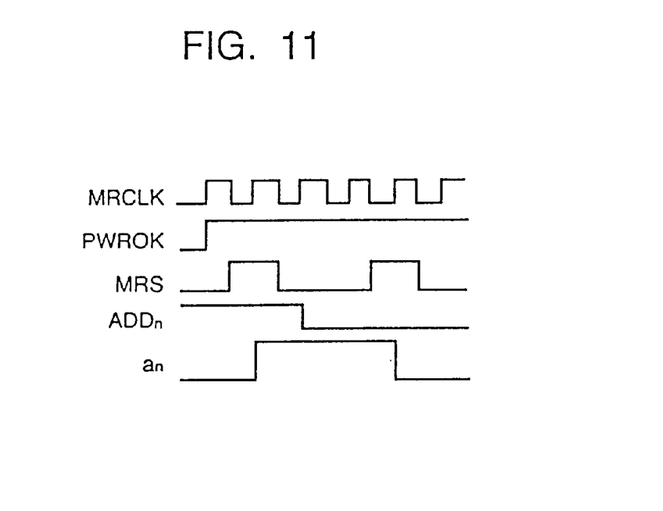
FIG. 11 is a timing chart of signals inputted to the latch circuit of FIG. 9.

The resistor 314 is a circuit for adjusting the delay of the internal delay reproduction circuit 307. The resistor 314 comprises a plurality of latch circuits. A latch circuit 314a illustrated in FIG. 9 includes a general flip-flop 316 as shown in FIG. 10. The initial signal PWROK, a delay adjusting mode signal MRS, an address signal $ADD_n$, and a clock MRCLK are respectively inputted to the latch circuit 314a. The initial signal PWROK is connected with a terminal R of the flip-flop 316, and the clock MRCLK is connected with a terminal CK of the flip-flop 316.

The delay adjusting mode signal MRS is connected with an inverter 61 of the latch circuit and the inverter 61 is connected with one input terminal of an AND element 62. The other input terminal of the AND element 62 is connected with a terminal Q of the flip-flop 316. The delay adjusting mode signal MRS is also connected with one input terminal of an AND element 63. The address signal $ADD_n$ is connected with the other input terminal of the AND element 63 and an address value is inputted to the other input terminal.

Outputs of the AND element 62 and AND element 63 are connected with a NOR element 64. An output of the NOR element 64 is connected with a terminal D of the flip-flop 316. A terminal Q of the flip-flop 316 is connected with the input terminal of the AND element 62 and a signal is outputted from the terminal Q as the signal $a_n$ and also outputted as the signal $/a_n$ via an inverter element 65.

The operation of the semiconductor device 300 having the construction set forth above is described with reference to timing charts in FIGS. 8 to 10 and FIG. 11. First, an address value for controlling the delay time generated by the delay adjusting circuit 313 is inputted to a terminal 315 of the resistor 314. In the latch circuit 314a shown in FIG. 9, the selection signal $a_n$ is initialized to low level by the initial signal PWROK. Since the delay adjusting mode signal MRS becomes high level when adjusting the delay time, it enters a delay adjusting mode where the address signal ADDn is latched while joined with the clock MRCLK, thereby outputting as the signal $a_n$. When the delay adjusting mode signal MRS becomes low level and the delay adjusting mode is released, latching is performed by a loop denoted by c in FIG. 9. Since the resistor 314 comprises a plurality of resistors 314, one of delay times is selected by the delay adjusting circuit 313 in response to the address value.

As mentioned above, the semiconductor device according to the preferred embodiments of the invention, the resistor 314 and delay adjusting circuit 313 are mounted on the semiconductor device, there is an effect that the delay time can be easily adjusted by inputting the designated address. Further, even if the semiconductor device is incorporated into a mold, the delay time can be adjusted so that evaluation including the influence of the package can be easily performed.

Although the preferred embodiments of the invention have been described with reference to the attached drawings, the invention is not limited to these embodiments. It is understood that the invention is conceivable to a person skilled in the art to include various modifications and changes within a scope of technical idea described in claims and these modifications and changes can belong to the invention as a matter of course.

For example, although the embodiments corresponding to the DLL circuit have been described, the invention is not limited to this DLL circuit. The invention can be applied to any semiconductor device if the signals are needed to join with each other by adjusting the phases thereof.

What is claimed is:

1. A semiconductor device comprising:
   an input terminal through which an input signal is input to the semiconductor device;
   an output terminal through which an output signal is output from the semiconductor device; and
   a phase adjusting circuit having a first node which is coupled to said input terminal and through which a first signal is input, and having a second node which outputs a second signal and which is coupled to said output terminal, said phase adjusting circuit adjusts phases of the input signal and the output signal output from said output terminal,
   the first signal having a first delay time corresponding to a period starting from a time when the input signal is input to said input terminal until a time when the input signal is input to said first node as the first signal, and the output signal having a second delay time corresponding to a period starting from a time when the second signal is output from said second node until a time when the second signal is output from said output terminal as the output signal, said phase adjusting circuit including
- a delay selection circuit that adjusts a phase of the first signal based on a control signal to provide the second signal,
- an internal delay reproduction circuit that delays the second signal by the first and second delay times to provide a third signal,
- a delay adjusting circuit that adjusts a phase of the third signal to provide a fourth signal,
- a delay time control section that controls said delay adjusting circuit, and
- a phase comparator that compares a phase of the first signal with a phase of the fourth signal to provide the control signal.

2. The semiconductor device according to claim 1, wherein said delay time control section comprises a plurality of fuse circuits including fuses, said delay adjusting circuit adjusts the phase of the third signal depending on which of the fuses are burnt.

3. The semiconductor device according to claim 2, wherein said delay time control section comprises n fuse circuits and said delay adjusting circuit comprises ($n^2-1$) delay elements.

4. The semiconductor device according to claim 3, wherein said delay elements are resistor elements.

5. The semiconductor device according to claim 3, wherein said delay elements are inverter elements.

6. The semiconductor device according to claim 1, wherein said delay time control section comprises a plurality of latch circuits, wherein the phase adjustment by said delay adjusting circuit is controlled by external address information that is input to each of said plurality of latch circuits.

7. The semiconductor device according to claim 6, wherein said delay time control section comprises n latch circuits and said delay adjusting circuit comprises ($n^2-1$) delay elements.

8. The semiconductor device according to claim 7, wherein said delay elements are resistor elements.

9. The semiconductor device according to claim 7, wherein said delay elements are inverter elements.

10. A semiconductor device comprising:
- an input terminal through which an input signal is input to the semiconductor device;
- an output terminal through which an output signal is output from the semiconductor device;
- an input buffer that buffers the input signal to provide a first signal that is phase delayed with respect to the input signal by a first delay time;
- a delay selector that adjusts a phase of the first signal in accordance with a control signal, to provide a second signal;
- an output buffer that buffers the second signal to provide the output signal to said output terminal, the output signal being phase delayed with respect to the second signal by a second delay time;
- a delay reproducer that delays the second signal by a sum of the first and second delay times to provide a third signal;
- a delay adjuster that adjusts a phase of the third signal to provide a fourth signal;
- a delay time controller that controls said delay adjuster; and
- a phase comparator that compares a phase of the first signal with a phase of the fourth signal to provide the control signal.

11. The semiconductor device according to claim 10, wherein said delay time controller comprises a plurality of fuse circuits including fuses that are selectively disabled, said delay adjuster adjusts the phase of the third signal depending on which of the fuses are disabled.

12. The semiconductor device according to claim 11, wherein said delay time controller comprises n fuse circuits and said delay adjuster comprises ($n^2-1$) delay elements.

13. The semiconductor device according to claim 12, wherein said delay elements are resistor elements.

14. The semiconductor device according to claim 12, wherein said delay elements are inverter elements.

15. The semiconductor device according to claim 10, wherein said delay time controller comprises a plurality of latch circuits, wherein the phase adjustment by said delay adjuster is controlled by external address information that is input to each of said plurality of latch circuits.

16. The semiconductor device according to claim 15, wherein said delay time controller comprises n latch circuits and said delay adjuster comprises ($n^2-1$) delay elements.

17. The semiconductor device according to claim 16, wherein said delay elements are resistor elements.

18. The semiconductor device according to claim 16, wherein said delay elements are inverter elements.

19. A semiconductor device comprising:
- an input terminal through which an input signal is input to the semiconductor device;
- an output terminal through which an output signal is output from the semiconductor device;
- an input buffer that buffers the input signal to provide a first signal that is phase delayed with respect to the input signal by a first delay time;
- a delay selector that adjusts a phase of the first signal in accordance with a control signal, to provide a second signal;
- an output buffer that buffers the second signal to provide the output signal to said output terminal, the output signal being phase delayed with respect to the second signal by a second delay time;
- a delay adjuster that adjusts a phase of the second signal to provide a third signal;
- a delay time controller that controls said delay adjuster;
- a delay reproducer that delays the third signal by a sum of the first and second delay times to provide a fourth signal; and
- a phase comparator that compares a phase of the first signal with a phase of the fourth signal to provide the control signal.

* * * * *